(12) United States Patent
Leung et al.

(10) Patent No.: US 8,174,325 B1
(45) Date of Patent: May 8, 2012

(54) ADAPTIVE INJECTION-LOCKED OSCILLATOR ARRAY FOR BROAD SPECTRUM RF ANALYSIS

(75) Inventors: Daniel Leung, San Diego, CA (US); Joseph Neff, San Diego, CA (US); Norman Liu, San Mateo, CA (US); Visarath In, Chula Vista, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 37 days.

(21) Appl. No.: 12/903,287

(22) Filed: Oct. 13, 2010

(51) Int. Cl.
*H03B 27/00* (2006.01)

(52) U.S. Cl. .................. 331/2; 331/46; 331/50; 331/55; 331/42; 331/57

(58) Field of Classification Search ................ 331/2, 46, 331/50, 55, 42, 57
See application file for complete search history.

(56) References Cited

U.S. PATENT DOCUMENTS

| | | | |
|---|---|---|---|
| 5,528,445 | A | 6/1996 | Cooke |
| 6,008,642 | A | 12/1999 | Bulsara |
| 6,020,782 | A | 2/2000 | Albert |
| 6,714,469 | B2 | 3/2004 | Rickes |
| 6,785,629 | B2 | 8/2004 | Rickes |
| 7,154,768 | B2 | 12/2006 | Chen |
| 7,196,590 | B1 | 3/2007 | In |
| 7,420,366 | B1 | 9/2008 | In |
| 7,528,606 | B1 | 5/2009 | In |
| 7,714,671 | B1 | 5/2010 | In |
| 2009/0195245 | A1 | 8/2009 | In |

OTHER PUBLICATIONS

V. In, A. Kho, J. Neff, A. Palacios, P. Longhini, and B. Meadows, "Experimental Observation of Multifrequency Patterns in Arrays of Coupled Nonlinear Oscillators," APS, Phys. Rev. Let., vol. 91, No. 24, Dec. 2003.

P. Longhini, A. Palacios, V. In, J. Neff, A. Kho, and A. Bulsara, "Exploiting dynamical symmetry in coupled nonlinear elements for efficient frequency down-conversion," APS, Phys. Rev. E, vol. 76, issue 2, Aug. 2007.

S. Verma, H. Rategh, and T. Lee, "A unified model for injection-locked frequency dividers," IEEE J. Solid-State Circuits, vol. 38, No. 6, pp. 1015-1027, Jun. 2003.

R. Melville, D. Long, V. Gopinathan, and P. Kinget, "An injection locking scheme for precision quadrature generation," IEEE J. Solid-State Circuits, vol. 37, No. 7, pp. 845-847, Jul. 2002.

B. Razavi, "A study of injection locking and pulling," IEEE J. Solid-State Circuits, vol. 39, No. 9, pp. 1415-1424, Sep. 2004.

A. Mirzaei, M. Heidairi, R. Bagheri, and A. Abidi, "Multi-phase injection widens lock range of ring-oscillator-based frequency dividers," IEEE J. Solid-State Circuits, vol. 43, No. 3, pp. 656-671, Mar. 2008.

(Continued)

*Primary Examiner* — Arnold Kinkead
(74) *Attorney, Agent, or Firm* — Kyle Eppele; Stephen E. Baldwin

(57) ABSTRACT

The present invention provides an array of tunable, injection-locking oscillators which are scalable to higher frequencies and measure the entire relevant frequency space simultaneously. The scalable, highly-parallelized, adaptive receiver architecture uses arrays of tunable, injection-locking nonlinear oscillator rings for broad spectrum RF analysis. Three separate and different microelectronic circuit configurations, each having a different type of readout, are described. The embodiments are designed to be incorporated as a subsystem in any type of powered system in which a fast image of the broader spectrum is valuable, when no information about the location of signals in the frequency space is predictable or forthcoming.

14 Claims, 13 Drawing Sheets

A closed-loop configuration through amplifier K allows for a higher precision output.

Configuration 3

OTHER PUBLICATIONS

R. Adler, "A study of locking phenomenon in oscillators," Proc. IEEE, vol. 61, pp. 1380-1385, Oct. 1973.

P. Bhansali and J. Roychowdhurry, "The generalized Adler's equation for injection locking analysis in oscillators," IEEE APS, APSURSI, pp. 522-527, 2009.

H. Stover, "A theoretical explanation of the output spectra of unlocked driven oscillators," Proc. IEEE, vol. 54, pp. 310-311, Feb. 2006.

T. Gathman and J. Buckwalter, "Injection-locked oscillators for spectrum analysis," IEEE RFIC Symposium, pp. 575-578, Jun. 2009.

D. Garcia-Alvarez, A. Stefanovska and P. McClintock, "High order syncrhonization, transitions, and competition among Arnold tongues in a rotator under harmonic forcing," APS, Phys. Rev. E, vol. 77, issue 5, Mar. 2009.

T. Gathman and J. Buckwalter, "A balanced injection-locked, phase-locked loop array for spectrum analysis," IEEE Antennas and Propagation Soc., Int'l Symposium, pp. 1-4, Jun. 2009.

U.S. Appl. No. 12/732,023, filed Mar. 25, 2010, titled "Coupled Bi-Stable Microcircuit System for Ultra-Sensitive Electrical and Magnetic Field Sensing".

U.S. Appl. No. 12/391,508, filed Feb. 24, 2009 titled "Wideband Non-Linear Circuits for Implementation in Frequency Channel Separation".

U.S. Appl. No. 12/561,996, filed Sep. 17, 2009 titled "Frequency Down-Conversion System Using Arrays of Coupled Non-Linear Elements".

U.S. Appl. No. 12/175,262, filed Jul. 17, 2008 titled Coupled Electric Field Sensors for DC Target Electric Filed Detection.

FIGURE 6  Configuration 1

FIGURE 8 Configuration 2

An additional logic block allows for amplitude and frequency information about the signal.

FIGURE 10  Configuration 3

A closed-loop configuration through amplifier K allows for a higher precision output.

FIGURE 12    Injection-Locking Oscillator

FIGURE 13 Phase Detector

ADAPTIVE INJECTION-LOCKED OSCILLATOR ARRAY FOR BROAD SPECTRUM RF ANALYSIS

FEDERALLY-SPONSORED RESEARCH AND DEVELOPMENT

This invention (Navy Case No. 100,435) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

BACKGROUND

Two common RF (radio frequency) spectrum analysis technologies include heterodyne architectures and direct digitization methods. Common as well are various combinations and variants of the two.

Heterodyne architectures work by mixing the input signal with the low-phase noise output of a local oscillator with a known reference frequency, and measuring the power through a high-Q, band-pass filter or high-order low-pass filter. The known reference frequency of the local oscillator is then swept back and forth across the desired frequency space to obtain the power spectral image, one point at a time. The other method, direct digitization, works by employing high-performing, analog-to-digital converters to measure the voltage/current waveform of the signal directly. Fourier analysis and similar mathematical methods are performed by a computer and appropriate digital signal processing software to produce the power spectral image.

A disadvantage of the heterodyne architecture is the need for the local oscillator to sweep across the frequency space, and is limited by the speed at which it can do so while still preserving an accurate measurement across the required frequency space. A disadvantage of a direct digitization method is the tradeoff between the sampling rate and the resolution of analog-to-digital converters, as well as the reliance on secondary software computation, which is in general slower than completely analog methods designed and implemented solely in hardware. In addition, the size and power requirement for both these methods is especially disadvantageous when compared to the invention for higher frequencies.

SUMMARY

The present invention provides an array of tunable, injection-locking oscillators which are scalable to higher frequencies and measure the entire relevant frequency space simultaneously. The scalable, highly-parallelized, adaptive receiver architecture uses arrays of tunable, injection-locking nonlinear oscillator rings for broad spectrum RF analysis. Three separate and different microelectronic circuit configurations, each having a different type of readout, are described. The embodiments are designed to be incorporated as a subsystem in any type of powered system in which a fast image of the broader spectrum is valuable, when no information about the location of signals in the frequency space is predictable or forthcoming.

BRIEF DESCRIPTION OF THE DRAWINGS

Throughout the several views, like elements are referenced using like reference numerals, wherein.

DETAILED DESCRIPTION OF THE EMBODIMENTS

Figures 1, 2:
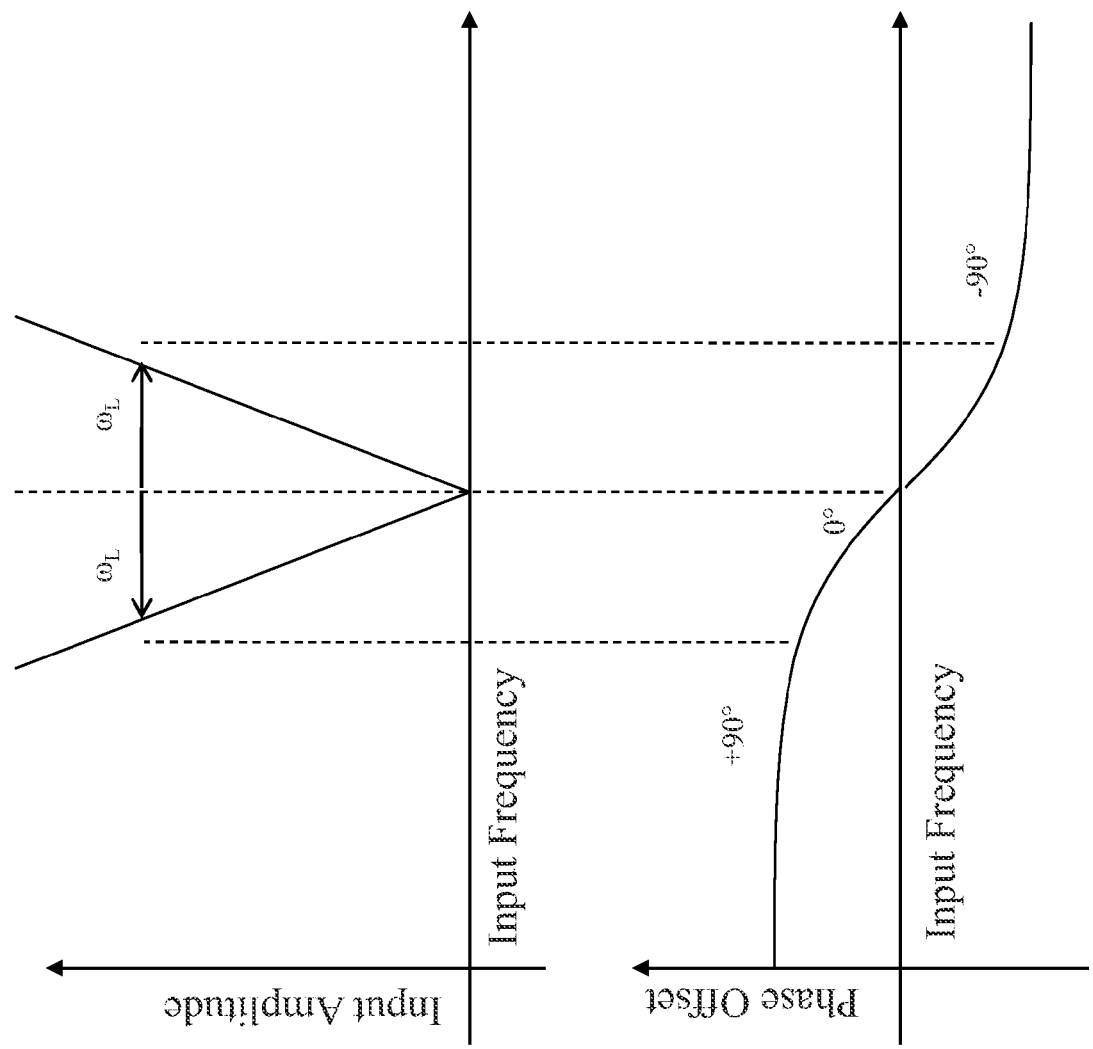
FIG. 1 shows a V-shaped plot (called an Arnold tongue plot) of input amplitude compared to input frequency.
FIG. 2 shows a diagram of phase relation of the input frequency to the output of the injection-locked oscillator.

The present invention is a scalable, highly-parallelized, adaptive receiver architecture using arrays of tunable, injection-locking nonlinear oscillator rings for broad spectrum RF analysis. Three separate and different microelectronic circuit configurations, each having a different type of readout, are described. The embodiments are designed to be incorporated as a subsystem in any type of powered system in which a fast image of the broader spectrum is valuable, when no information about the location of signals in the frequency space is predictable or forthcoming.

An array of injection-locking oscillator (ILO) rings tuned to oscillate with different natural frequencies, whose phase response is a function of the input amplitude and frequency can be used to quickly determine the presence of radio-frequency signals.

Correlating the response of at least two such oscillators that are locked to the same signal yields a determined solution for both the signal amplitude and frequency. Several variations of this system are described for their application toward rapid and accurate RF detection.

Theory

Injection-Locking

Injection-locking is a type of synchronization phenomenon that occurs in many different periodic processes. It has been studied extensively in physics and engineering. Examples of synchronization can be found in choruses of chirping crickets, animal circadian rhythms and the pulse rate of the human heartbeat. In each, a self-periodic process is influenced by an external driver, whether that driver is sound, light, or pulses of electricity. If the frequency detuning is small enough, and the amplitude of the driver is strong enough, the process will adopt exactly the frequency of the driver.

Injection-locking in electronic oscillators are found in applications involving frequency synthesis, frequency division and phase-locked loops. Injection locking can be achieved in relaxation oscillators like ring oscillators with inherent nonlinearity, or in harmonic oscillators with sufficient nonlinearity added by active elements. Locking is achieved via direct injection of a relatively small, periodic signal current. In multi-staged oscillators, injection of the signal into one-stage is sufficient, but a multi-stage, multi-phase injection can greatly increase the locking bandwidth.

Conditions for Injection-Locking

The region of synchronization, or the locking bandwidth, is determined by the relative oscillation amplitude of the free-running oscillator and the amplitude of the injected signal. An oscillator with small current oscillation is more susceptible to injection-locking than one which has high oscillation amplitude. For weak forcing, Adler's equation (1) is often cited to predict the locking region for LC oscillators, and can be generalized to ring oscillators (2) as well.

$$\frac{d(\Delta\varphi)}{dt} = -\frac{I_{inj}\omega_0}{I_{osc}2Q}\sin(\Delta\varphi) + \Delta\omega_0 \quad (1)$$

$$\frac{d(\Delta\varphi)}{dt} = -(\Delta f) + f_0 \cdot \frac{RI_{inj}}{A} \cdot g(\Delta\varphi) \quad (2)$$

For visualization purposes, FIG. 1 shows a plot of an Arnold tongue (named after Vladimir Arnold) which is depicted as a V-shape. FIG. 1 is used to illustrate the behavior states. For a signal within the locking region, the oscillator follows the frequency of the signal with a determined phase offset. Otherwise, the oscillator free-runs close to its natural frequency. For sufficiently strong and nearby signals, significant pulling can occur, which is undesirable.

Phase-Response During Injection-Locking

When the ILO is locked to the signal, the output will adopt the frequency of the signal, and will also adopt a determined phase offset relative to the injected signal. The phase offset is a function of the locking bandwidth and the signal's placement within the region. This is shown in FIG. 2, which shows the phase relation of the signal to the output injection-locked oscillator and is one way to determine the locking bandwidth, where ±90° represents the edges.

Signal injection at the natural frequency of the oscillator results in a 0° phase offset. Injection below the natural frequency results in a phase offset from 0° to +90°. Injection above the natural frequency results in a phase offset from 0° to −90°. At the edges and over ±90°, the constant phase difference is not sustained and injection-locking is usually not observed. Instead, significant phase noise is present due to frequent phase slips. This is in contrast to the improvement of the phase noise during lock. Injection-locking can be detected by phase discrimination of the output of the oscillator against a tap-off of the original signal. If the frequencies are equal, the phase will vary between −90° and +90°. Otherwise, a low-pass function or a peak detector will block any intermediate frequencies.

Detection of synchronization with this approach sets a second time-scale separate from the injection-locking dynamics, and is equivalent to the RC time-constant of the low-pass.

Transient Response of Injection-Locking

Figure 3:
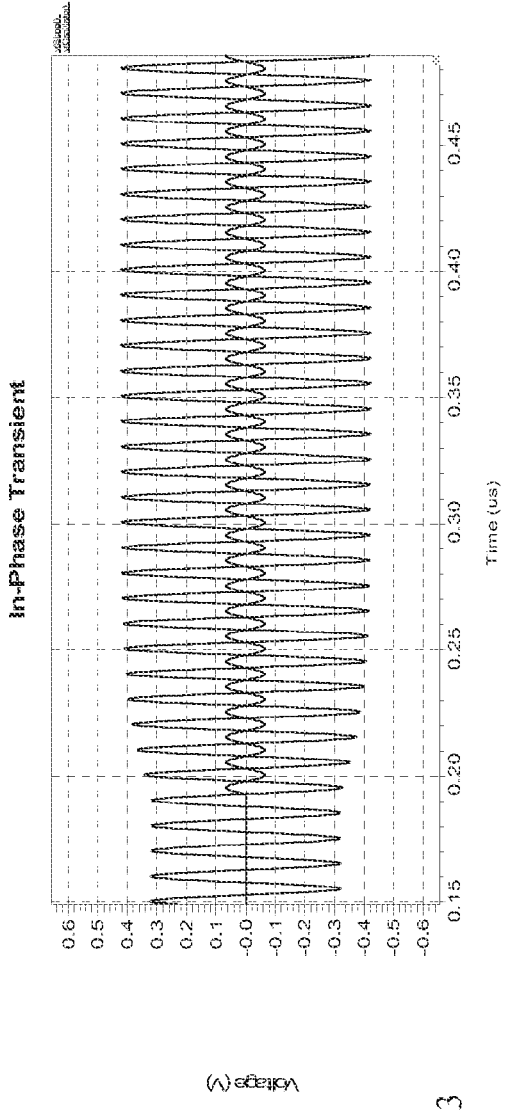
FIG. 3 shows a plot of tone matching the natural frequency which is injected in-phase with the anti-phase steady state.

FIG. 3 shows a simulation where tone matching the natural frequency is injected in-phase with the anti-phase steady-state. The result is that the oscillator settles very quickly due to fortunate initial condition.

Figure 4:
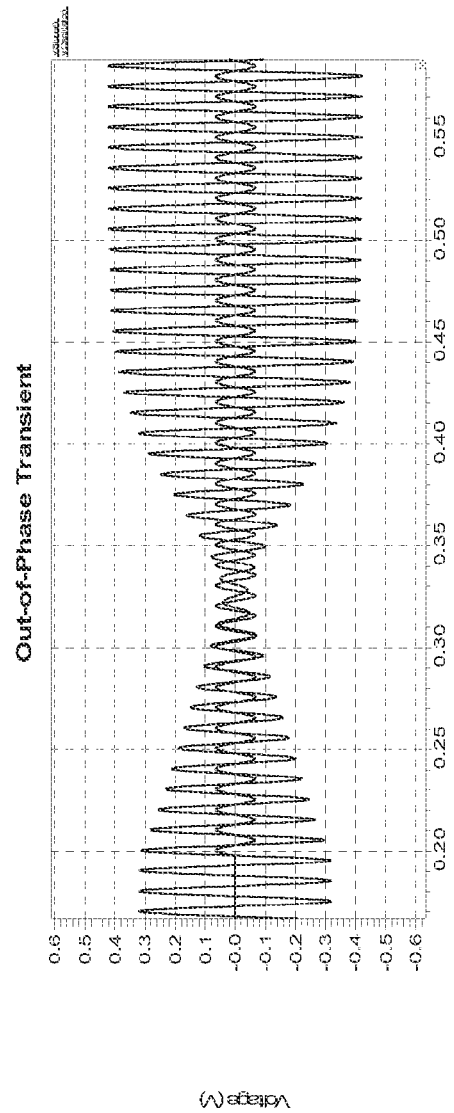
FIG. 4 shows a plot of tone matching the natural frequency which is injected out-of-phase with the anti-phase steady state.

FIG. 4 shows a simulation where tone matching the natural frequency is injected out-of-phase with the anti-phase steady-state. The result is a prolonged settling time due to unfortunate initial condition.

The first time-scale is the injection-locking itself. The settling time is proportional to the frequency and the locking bandwidth. In addition, a random time delay representing the initial phase difference at the start of injection sets the total amount of shift required over time to bring the oscillator into steady-state phase-lock. Two simulations, shown in FIG. 3 and FIG. 4, of an idealized Van der Pol phase-amplitude oscillator implemented in Verilog-A, illustrates the dependency of the settling time on the initial conditions. A fixed injection current of approximately 5% of the modeled oscillator's current amplitude is applied, resulting in a locking bandwidth of roughly 4 MHz, about a center frequency of 100 MHz. In FIG. 3, a 100 MHz tone is injected in-phase with the anti-phase steady state. The settling time is only a few periods long. In FIG. 4, the same 100 MHz tone is injected, but out-of-phase with the anti-phase steady-state, and the settling is much more.

The second time-scale is the detection. Due to self-oscillation, there is an output whether there is a signal present or not. For this reason, a reference signal is used to determine the locked condition. A mixer and low-pass filter can be used to determine if the ILO is locked to the signal, or a neighbor ILO. Using this approach, the dominant time delay from input to reliable detection of an in-band signal is limited by the cutoff and order of the low-pass function in the phase detector.

With a comparator acting as a threshold decision, the time to detection also depends on the frequency detuning. The output of the phase detector with a signal in the center will pass the threshold earlier than with a signal at the edge. Time to detection is determined in part also by the desired channel resolution. For smaller channel bandwidths, the frequency detuning can be small and not cause synchronization. The mixing stage creates the sum and difference frequency of the ILO and the signal itself. For like signals, the difference will be very low, requiring a lower cutoff or a higher order low-pass filter. This suggests that channels with large locking bandwidths have lower detection times as well as lower times to injection-lock. This previous analysis is constrained by the effects of injection pulling, and the spectra of unlocked, driven oscillators.

Intermodulation Interference

Due to the nonlinearity of the ILO, injection of multiple signals can cause undesirable behavior. In the presence of two in-band signals, the ILO will lock to the stronger of the two. However, the other signal is not wholly rejected and appears in the output spectrum as symmetric side-bands. In the design of linear circuits, devices are made to be as linear as possible across their specified input range. However, for injection locked oscillators, this design principle must be balanced against the desired functionality since the nonlinearity provides for both the locking behavior as well as the susceptibility to intermodulation. In regard to signal detection, interference can degrade performance by causing false detections. A conservative threshold circuit is required to account for false detections due to inter-modulation products and increased ripple at the output of the phase detector.

In order to channelize large tracts of the spectrum, an array of oscillators is tuned at equal frequency intervals, with equal locking bandwidths. Specifying a minimum and maximum signal amplitude within the combined locking bandwidth, detection of signals is achieved with the activation of one or multiple channels.

Open-Loop Configurations

Figure 5:
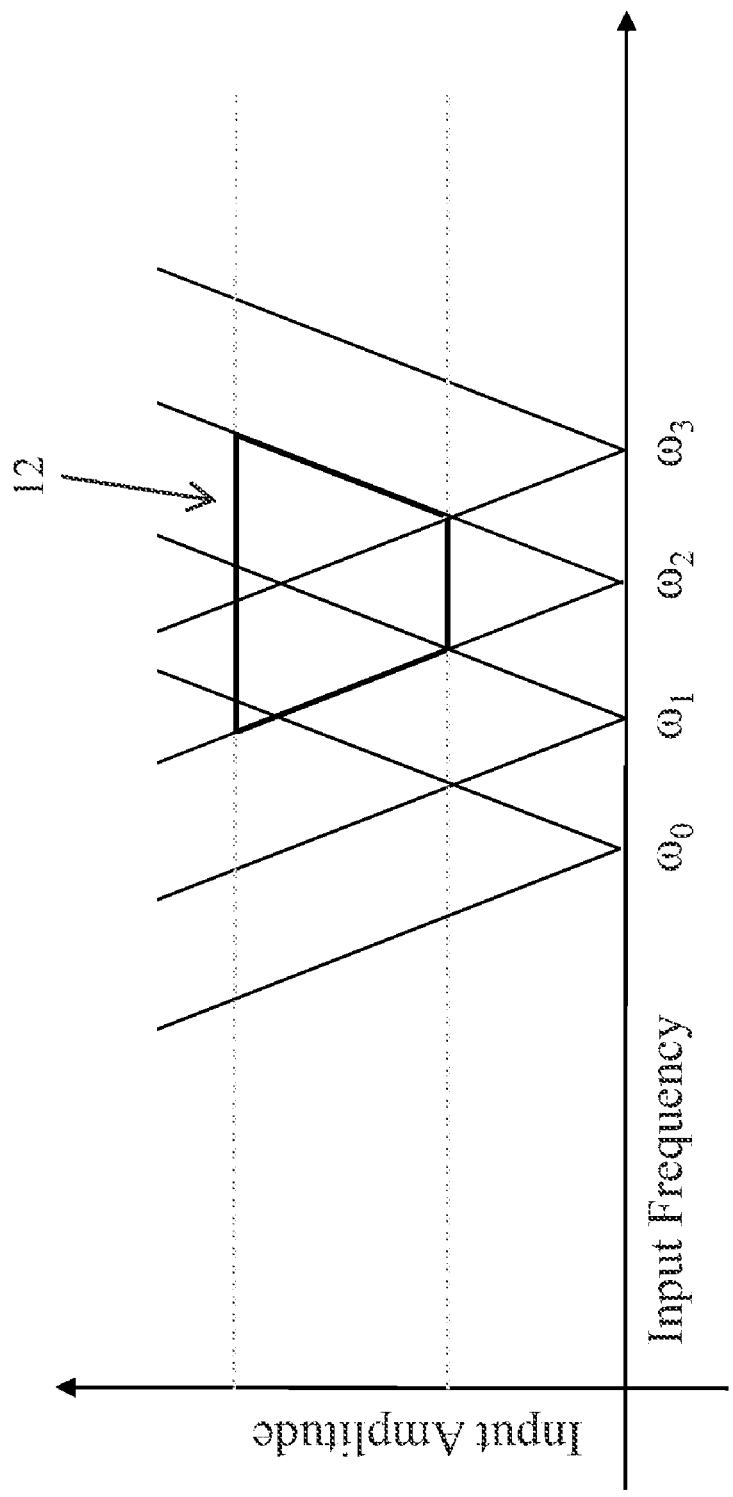
FIG. 5 shows a plot of activation of one or more channels corresponding to detection of a carrier within a trapezoidal region.

FIG. 5 shows a plot of activation of one or more channels which corresponds to detection of a carrier within the trapezoidal region 12, defined by a minimum and maximum, as well as the locking region itself.

Figure 6:
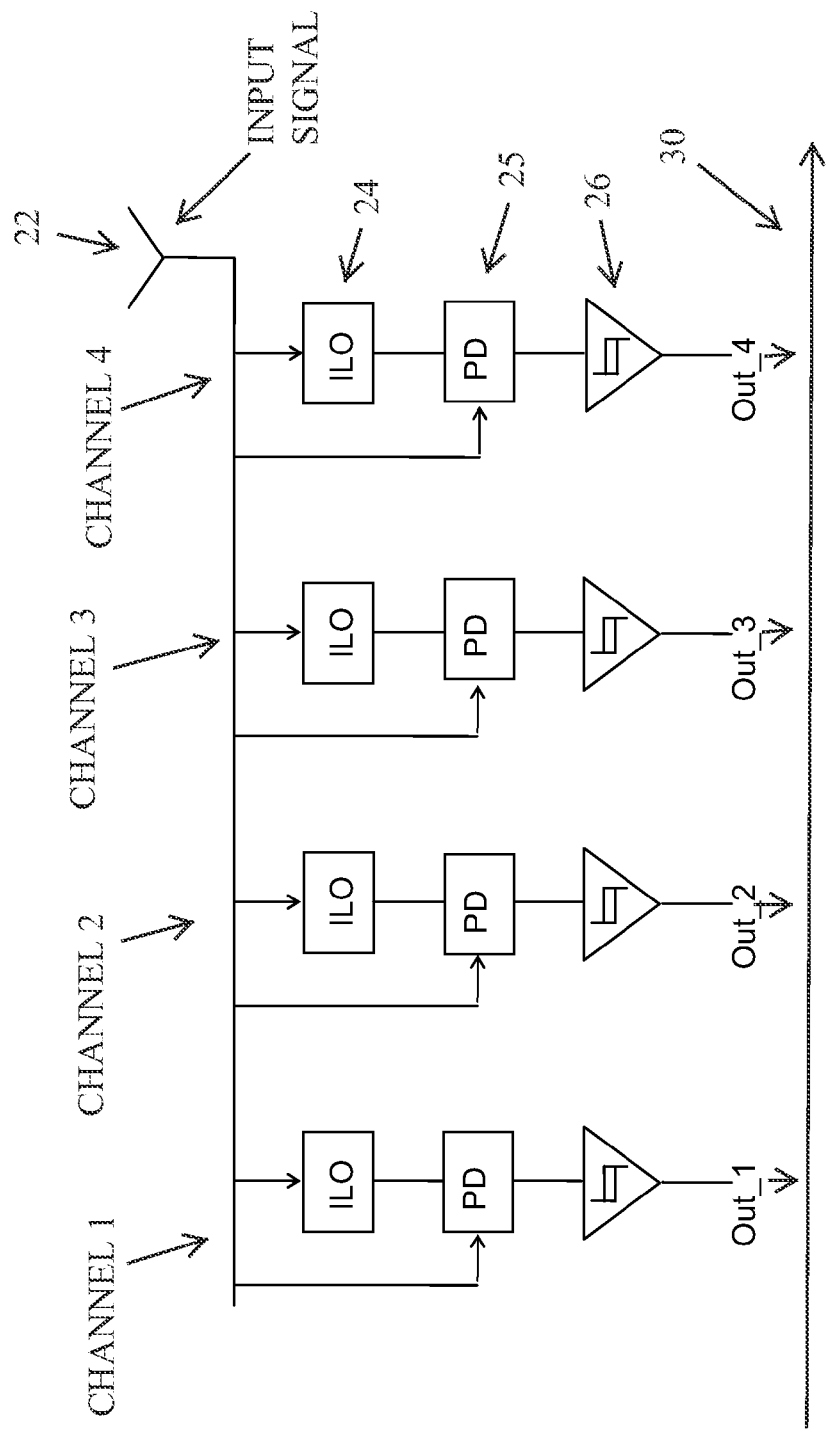
FIG. 6 shows an ILO configuration block diagram of the present invention.

FIG. 6 shows a basic ILO configuration block diagram. The embodiment shown in FIG. 6 includes four independent channels (i.e., Channel 1, Channel 2, Channel 3, Channel 4) simultaneously receiving an input signal from an antenna 22. In other embodiments, there could be multiple antennas or and many more channels (e.g., N channels). Each Channel N includes an oscillator (ILO), phase detector (PD), and a threshold (comparator) circuit, which forms an output Out_N, which are connected to a digital output bus 30.

In FIG. 6, Channel 4 includes ILO 24, which receives the input signal from antenna 22. For Channel 4, PD 25 receives the output of ILO 24, as well as the input signal from antenna 22. Threshold circuit (comparator) 26 receives the output of PD 25 and forms the output signal Out_4, which is an input to digital output bus 30. Remaining Channels 1-3 are configured in a similar manner in FIG. 6, which could be configured into many channels (N channels). As shown in FIG. 6, the output of each ILO in a Channel is compared with the input signal itself via the respective PD and comparator to determine synchronization.

Figure 7:
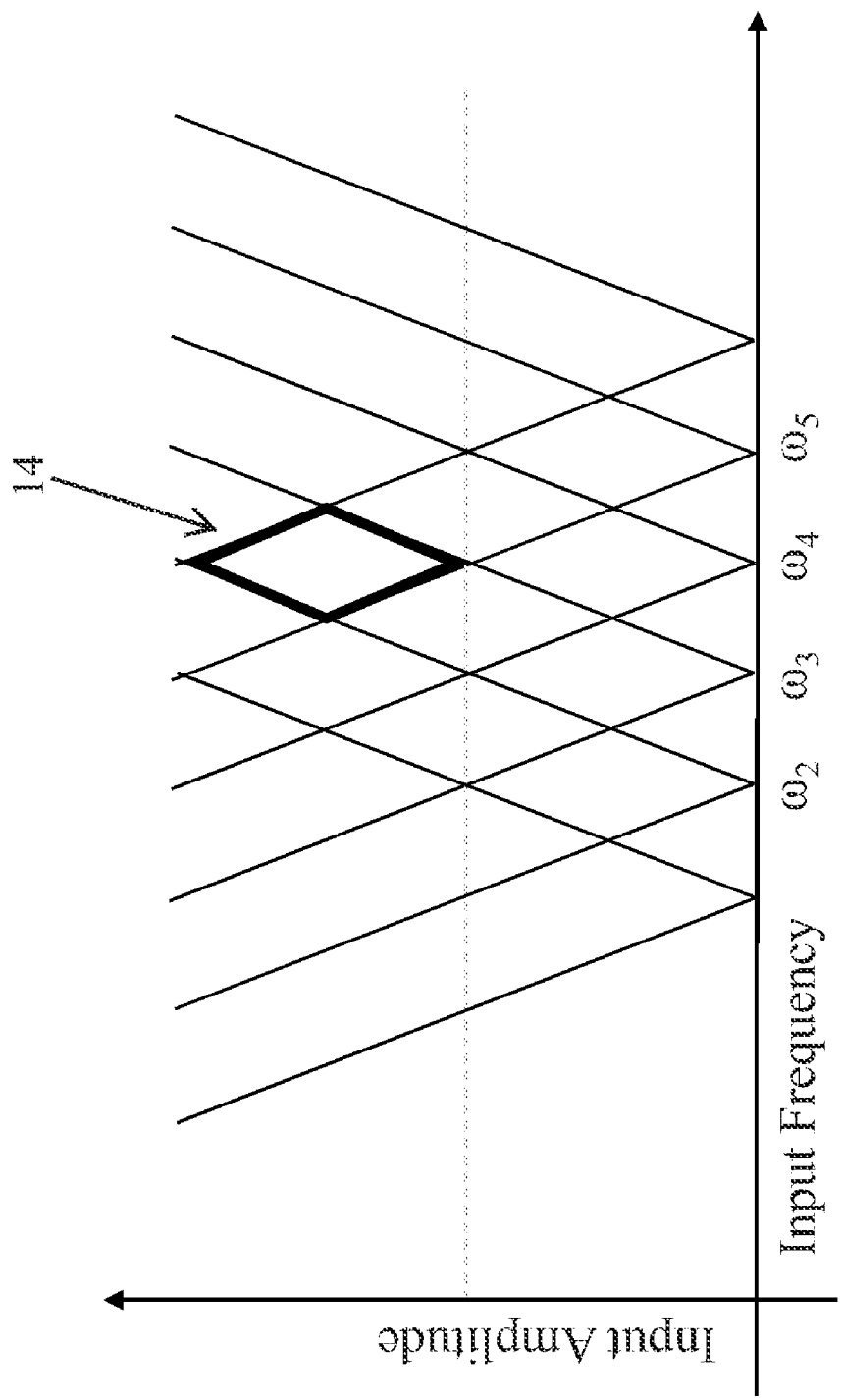
FIG. 7 shows a region map illustrating a bounded diamond region the unique case that three oscillators are locked to the same signal.

FIG. 7 shows a region map which illustrates a bounded diamond region 14 in the unique case that only three of the ILO oscillator $\omega 3$, $\omega 4$, and $\omega 5$ are locked to the same signal, bounded on both sides by $\omega 2$ and $\omega 6$, which are free-running.

Figure 8:
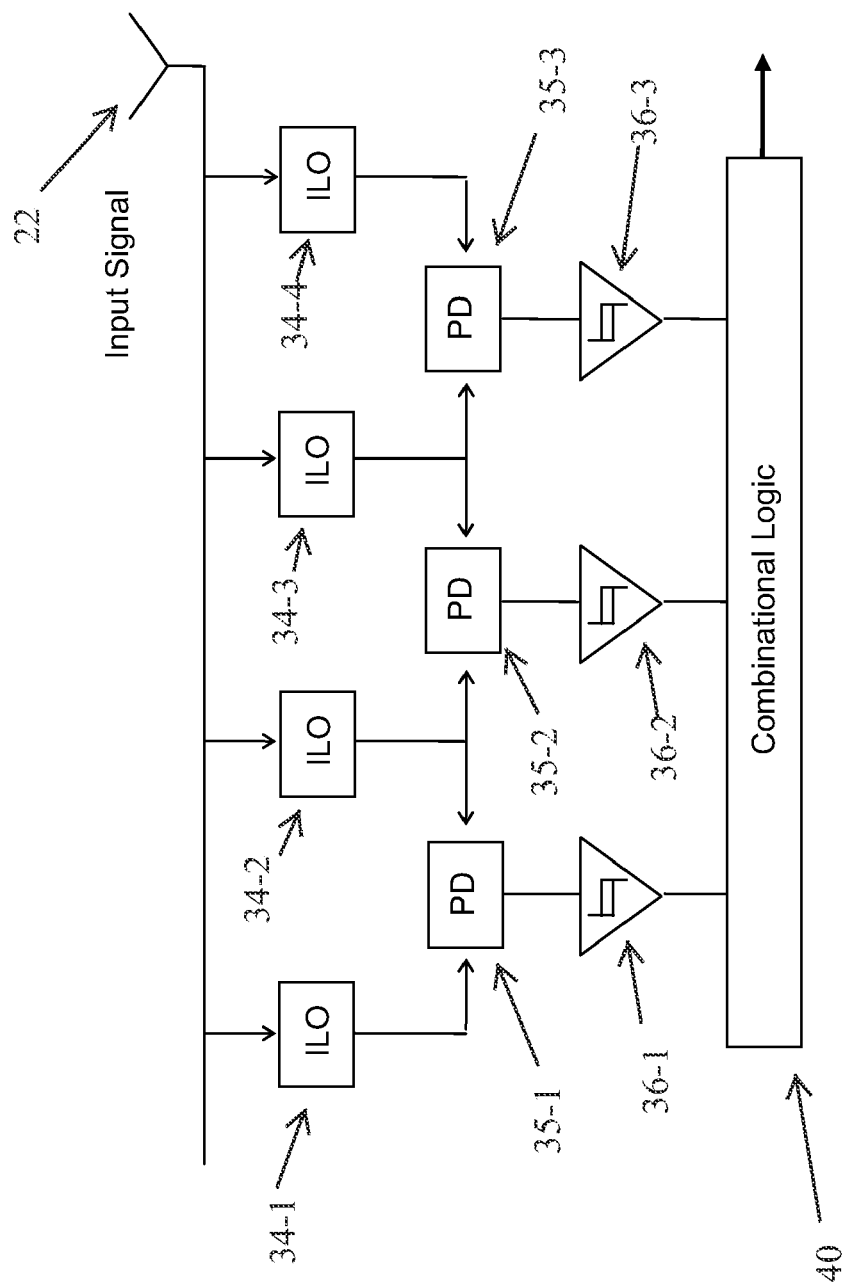
FIG. 8 shows another configuration block diagram of the present invention.

FIG. 8 shows an alternative ILO configuration that correlates the phase response of neighboring channels which can be used to improve frequency resolution as well as provide an estimation of the detected signal amplitude. Each neighboring ILO shown in FIG. 8 is connected in common to a respective PD circuit, the output of which is connected to a respective threshold (comparator) circuit. The combinatorial logic block 40 provides amplitude and frequency information about the signal.

In FIG. 8, as an example, neighboring ILO 34-1 and ILO 34-2 simultaneously receive an input signal from antenna 22, and provide respective outputs to PD 35-1, which has an output to comparator 36-1. Similarly, neighboring ILOs 34-2 and 34-3 provide inputs to PD 35-2, which has an output to comparator 36-2, and ILOs 34-3 and 34-4 provide inputs to PD 35-3, which has an output to comparator 36-3. The outputs of comparators 36-1, 36-2, 36-3 are input to combinatorial logic 40, which allows for amplitude and frequency information about the input signal from antenna 22.

Figure 9:
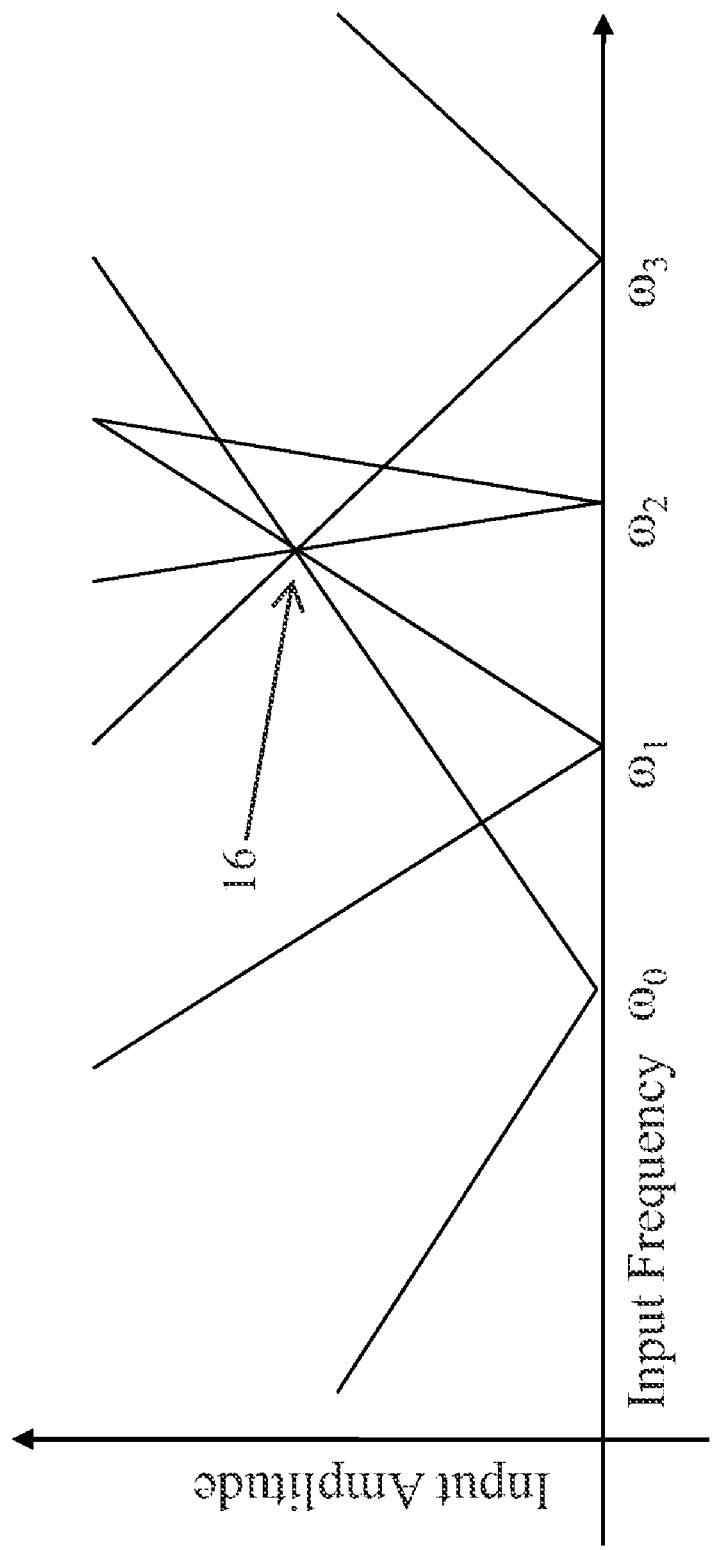
FIG. 9 shows a plot of gain stages used to fit the locking region to the detected signal.

FIG. 9 shows a plot that gain stages can be used to fit the locking region to the detected signal. The region map shown in FIG. 9 indicates the presence of a signal with amplitude and frequency at intersection point 16.

Figure 10:
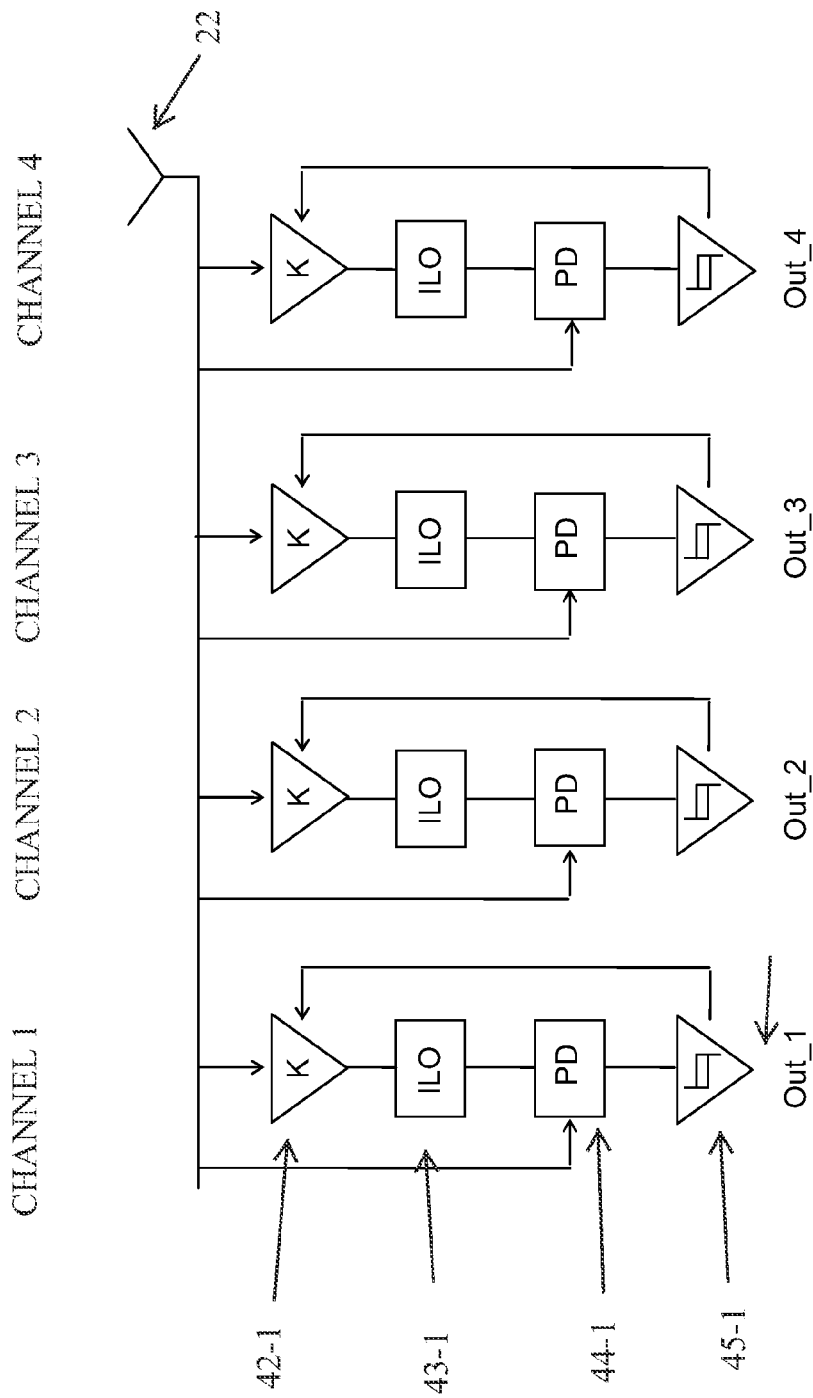
FIG. 10 shows a closed loop configuration block diagram of the present invention.

FIG. 10 shows a closed-loop configuration which offers additional precision and robustness at the cost of a few additional devices, extra routing and prolonged settling time. Each channel in FIG. 10 includes an amplifier K with input to a respective ILO, then to a respective PD and threshold circuit, which has a closed-loop connection back to amplify K.

Basic Injection-Locked Oscillator Array

A first configuration, shown in FIG. 6, employs no backend processing. For example, in FIG. 5, an illustration of the region map indicates that a signal is present within the locking region of channel two ($\omega_2$), and possibly channel one ($\omega_1$) and three ($\omega_3$) as well. A binary vector N-bits long serves as the output, where N is the number of channels. This approach yields neither the number of signals nor their amplitudes, only the activation of individual channels. In addition, a strong signal may be able to recruit multiple channels. In this case, thresholding, i.e. injection of a square-wave, is an option to prevent saturation of the channelizer, but greatly reduces the sensitivity to multiple signals.

Injection-Locked Oscillator Array with Logic:

The configuration shown in FIG. 8 is used to differentiate between carriers as well as estimate signal amplitude by correlating the phase response of one channel with neighboring channels. A binary vector N−1 bits long serves as an intermediate output to a combinational logic module that can resolve the location of carriers by parsing for consecutive sets of set bits; e.g. an output of 0-0-1-1-0 corresponds to the presence of a carrier signal bounded in the diamond region shown in the region map of FIG. 7.

Multiple signals within the same locking bandwidth cause errors at the output, which is an irrelevant issue for the more basic topology. Another concern is the stability of the region of synchronization. The direct proportionality of the locking bandwidth to signal amplitude degrades as the assumption of weak and linear forcing is lost. There may also be significant curvature of the locking region due to competition among Arnold tongues for even larger signal amplitudes.

Closed-Loop Configurations

Automatic Gain Control: A configuration with negative feedback, shown in FIG. 10, is used to adapt the locking bandwidth to the detected signal. During a locked condition, the gain factor of an input stage for the ILO is decreased. During an unlocked condition, the gain factor is increased. In this way, the ILO is kept at the edge of synchronization, or at quadrature, with respect to the carrier. The inverse of the gain factor can then be digitized and read. Signals high in amplitude and that are close in frequency require less gain to maintain synchronization than for signals low in amplitude and far away in frequency.

This approach yields relative signal amplitudes, but requires equal channel spacing. Another configuration can be used to uniquely solve the amplitude and frequency of a signal by employing a second ILO in PLL configuration. The second loop is identical, but with a negative loop gain. This configuration uses twice the number of devices, but greatly reduces the settling time, due to continuous feedback that was not possible using only a single-loop.

In one embodiment, the present invention comprises four two-stage differential ring oscillators, four Gilbert-cell analog multipliers, assorted bias generation and output buffers. The architecture is identical to that shown in FIG. 8, except an additional phase-detector directly tapping the input is connected to the fourth ILO. Four first-order low-pass filters are implemented with discrete passives on the printed circuit board. The output capture and logic are implemented in flexible hardware like an FPGA or with LabView tools. Adjustment of biasing potentiometers is accomplished using either method.

Figure 11:
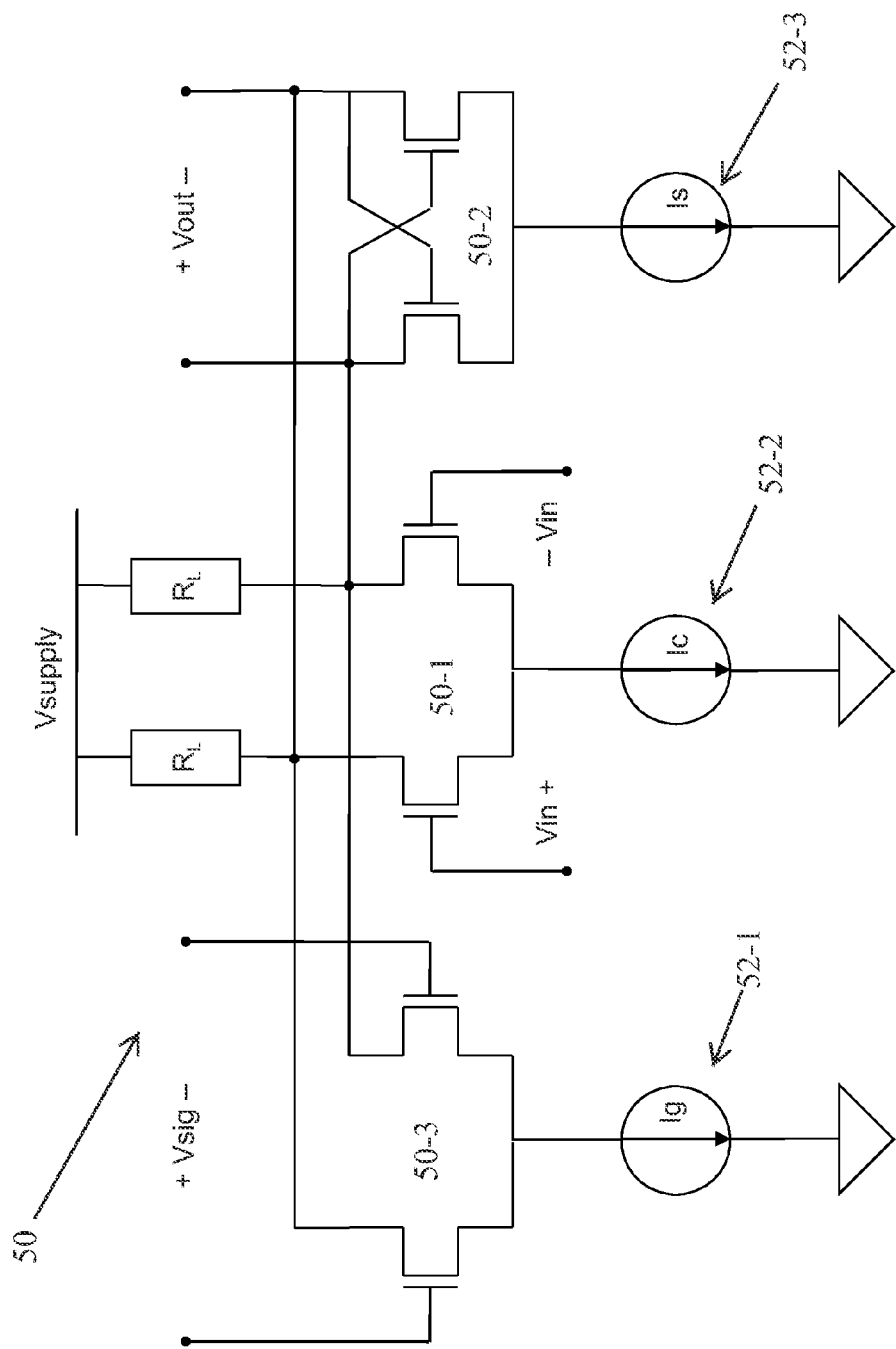
FIG. 11 shows a unit stage block diagram of the present invention.
Figure 14:
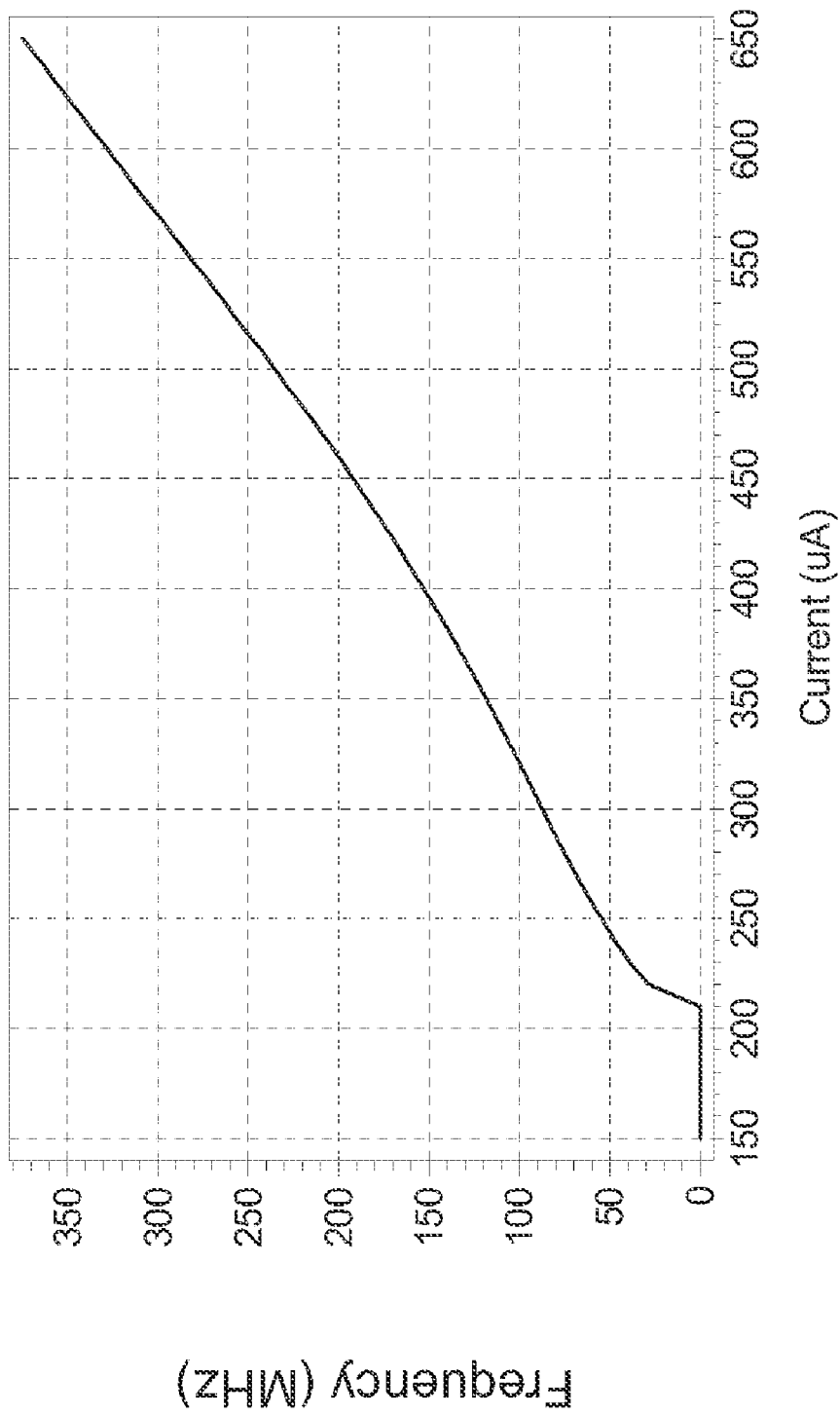
FIG. 14 shows a plot of tuning range of frequency compared with current.
Figure 15:
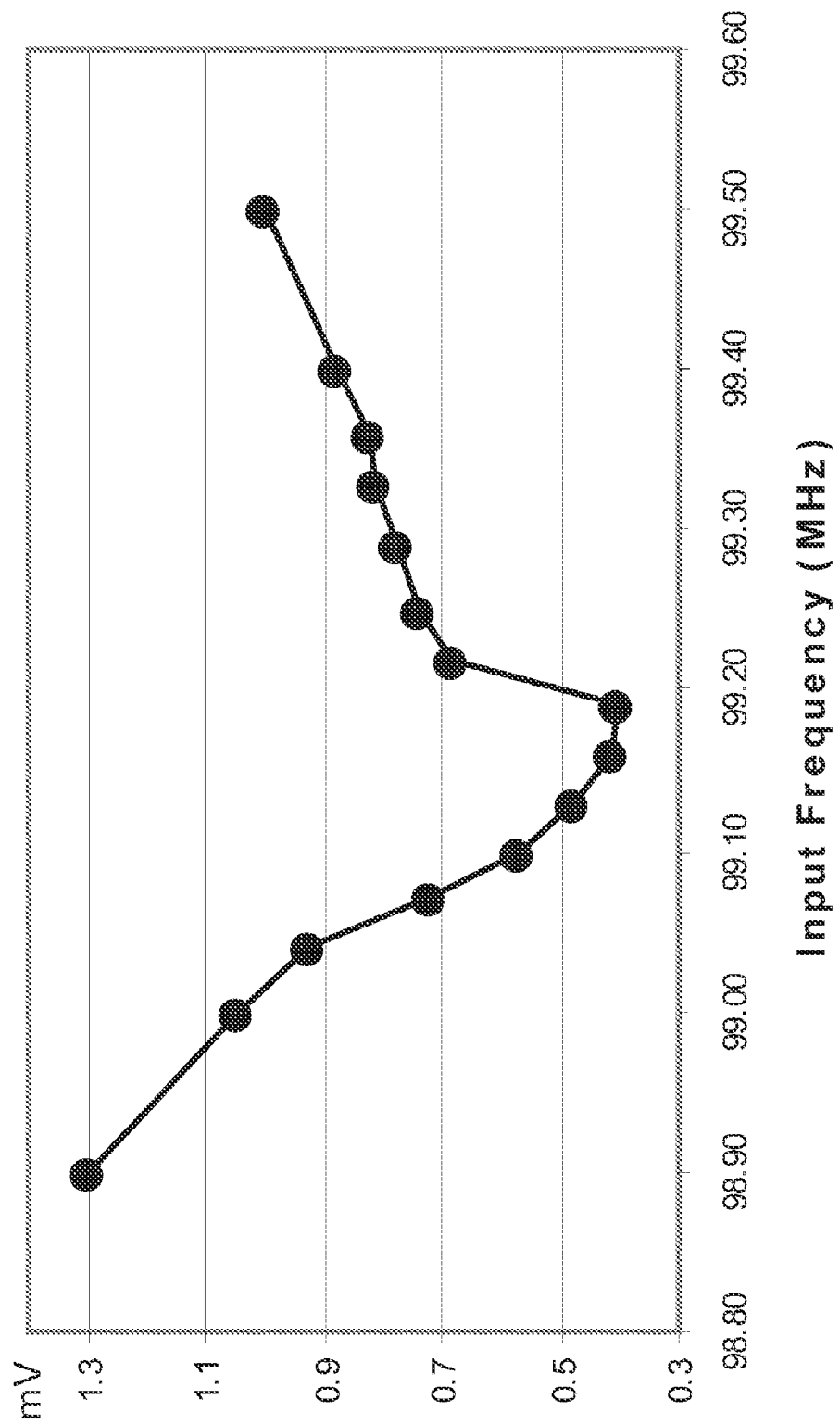
FIG. 15 shows an example of a locking region plot.

FIG. 11 shows a unit stage of the oscillator. Three matched pairs make up one stage of the oscillator, shown in FIG. 11. Bias currents $I_g$, $I_c$ and $I_s$ control the input differential pair, the frequency and the nonlinearity, respectively. This topology was chosen for tuning range, small area and past success. Simulation predicts a tuning range of 40-400 MHz for nominal $I_s$ bias, by tuning bias $I_c$, plotted in FIG. 14, which shows a plot of frequency with current, in which frequency vs. Ic, Is=330 µA, and example locking region plot in FIG. 15, which shows an Arnold tongue plot ($I_g$=330 uA, $I_c$=300 uA, $I_g$=330 uA).

Figure 12:
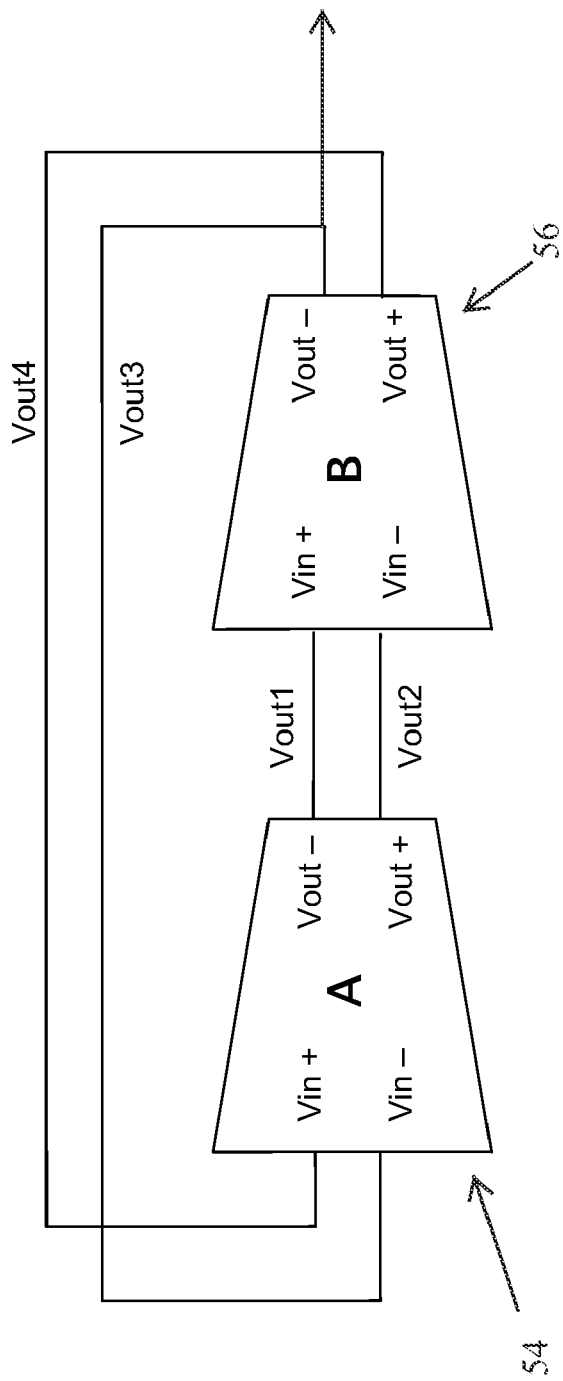
FIG. 12 shows a block diagram of an injection-locking oscillator of the present invention.

FIG. 12 shows a block diagram of the injection-locking oscillator of the present invention. In FIG. 12, the two Vsig+ and Vsig− are combined, the Ig, Ic, and Is are common, matched current mirrors, and are duplicated and identical in each of the two stages. The Vout3 signal is also shown as an output for the phase detector of FIG. 13.

Figure 13:
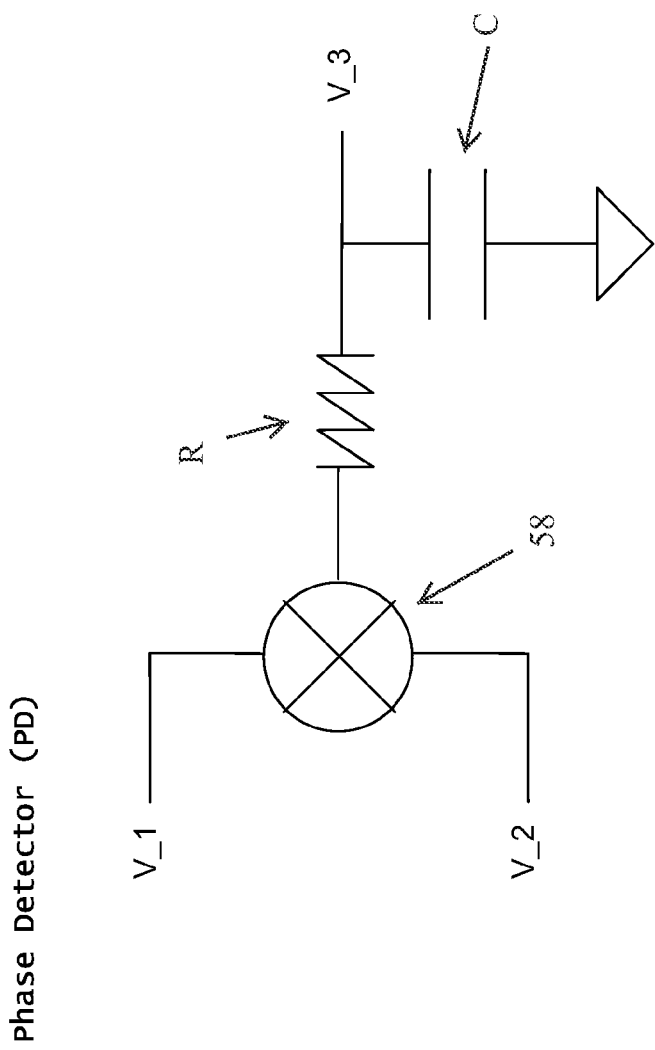
FIG. 13 shows a phase detector of the present invention.

FIG. 13 show a block diagram of a phase detector, which receives the Vout3 signal from the ILO of FIG. 12. The phase detector includes multiplier, and RC circuit. The V_1 signal in FIG. 13 is the Vout3 output from the ILO of FIG. 12, the V_2 is the signal itself, or the third output of a neighboring ILO, depending on the configuration chosen.

As has been described, the invention is a scalable, highly-parallelized, adaptive receiver architecture using arrays of tunable, injection-locking nonlinear oscillators for broad spectrum RF analysis. The invention consists of three separate and different microelectronic circuit configurations each having a different type of readout. The invention is designed to be incorporated as a subsystem in any type of powered system in which a fast image of the broader spectrum is valuable, when no information about the location of signals in the frequency space is predictable or forthcoming.

The unit stage 50 of the injection-locking oscillator shown in FIG. 11 includes a two-stage, differential pair (50-1) with an additional cross-coupled pair (50-2) to provide the requisite nonlinearity. The injection is accomplished via an additional input differential pair (50-3). Together, these components comprise a single stage, or element, in the oscillator. A second identical stage is connected, with one stage 54 inverting (FIG. 12) and with the other stage 56 non-inverting, to complete the oscillator circuit. The two figures show the topology of a single-stage (FIG. 11) and the overall injection-locking oscillator (ILO) circuit (FIG. 12).

The two Vsig+ and two Vsig− signals from FIG. 11 are combined, the Ig, Ic and Is signals are common, matched current mirrors from current sources 52-1, 52-2, 52-3, and are duplicated and identical in each of the two stages shown in FIG. 12.

Referring to FIG. 13, the phase detector (PD) circuit is implemented as an analog, double-balanced, Gilbert-cell multiplier 58, and a subsequent first-order, low-pass RC filter. The filter can be implemented using off-chip resistors and capacitors populated on a printed circuit board. On-chip filters and other types of integration or averaging methods would also be acceptable, and is a consideration in this current iteration of the invention.

A comparator circuit, or equivalent triggering circuit, such as a Schmitt trigger, is used to define a threshold voltage level and follows immediately the phase detection circuit. For testing purposes, this component is left out of this particular iteration of the invention, but is important in the display of the final readout. In addition, a combinational logic block, which can be designed by truth-table and Karnaugh-map, will encode the output bits of the comparator circuits to an amplitude and frequency bounded by the region of mutual synchronization. This is only applicable to the second configuration, where the response of each ILO in the array is compared against that of its neighbors.

The variable gain amplifier can be implemented using a dedicated, variable, RF front-end amplifier circuit, or can be accomplished by adjustment of the current bias Ig of the input differential pair (FIG. 11). In this particular iteration of the invention, the latter is combined with a electronically-variable potentiometer and software to provide the autonomous, negative amplitude feedback described in the publication.

Combined, the invention can take the form of three separate and different microelectronic circuit configurations using the components described. The first configuration is the Basic Injection-Locked Oscillator Array (FIG. 6) and is formed as an array of standard and independent injection-locked oscillators whose outputs are phase discriminated against the original input signal.

The second configuration is the Injection-Locked Oscillator with Logic (FIG. 8) and is formed as an array of standard and independent injection-locked oscillators whose outputs are phase discriminated against neighboring outputs.

The third configuration is the Injection-Locked Oscillator Array with Automatic Gain Control (FIG. 10) and is similar to the first configuration, but in addition, employs negative amplitude feedback to match the region of synchronization to the input signal such that quadrature phase, or close to quadrature phase, is maintained. The inverse of the applied feedback provides an image of the power spectrum. As stated previously, the operation of the invention is dependent upon the configuration chosen.

In FIG. 10, each channel includes an amplifier K, ILO, PD and comparator. The input signal from antenna 22 is simultaneously received by a respective amplifier K, the output of which is the input to the respective ILO. The respective PD in each channel receives the input signal and the output from the ILO for input to the comparator. The comparator forms a closed loop back to the respective amplifier K to form a closed-loop configuration.

For example, in FIG. 10, Channels 1-4 simultaneously receive an input signal from antenna 22. Channel 1 includes amplifier 42-1, which provides an amplified signal as an input to ILO 42-1, which in turn provides an input to PD 44-1. The input signal is also input to PD 44-1, which provides an input to comparator 45-1, the output of which is a closed-loop feed back to amplifier 42-1. Channels 2-4 function in a similar manner. There could be many channels incorporated into the configuration shown in FIG. 10 (e.g. N channels), as with the other embodiments.

Operation of the invention as a 'black box' works by adjustment of the three bias currents, Ig, Ic and Is. As shown in FIG. 11, the three bias currents provide for the necessary condition of oscillation as well as the location and width of the locking region in the frequency space. Ig is primarily responsible for the input gain and sets the width of the locking region. Ic and Is determine the location of the natural frequency and the nonlinearity of the output waveform. A signal current is applied at the input differential pair(s) Vsig+/−, and depending upon the amplitude and frequency of the signal, the readout will reflect the presence of signals in the spectrum.

The preferred embodiments provide a solution to the general problem of fast, broad spectrum RF analysis. The approach is non-traditional and offers an alternative solution to receiver design. In traditional receiver design, especially in testing and measurement systems, engineers go to great lengths to attain a highly linear input-output transfer function, such that the spectral content of the signal is preserved. This is to prevent harmonic distortion and intermodulation from occurring, and maintains a linear superposition of signals at the output of the device. The invention, however, purposefully employs nonlinearity, and from it, gains the synchronization behavior and uses the phase response information, which is not displayed in the power spectrum, to detect RF signals.

Contrasted against the heterodyning architecture, the invention does not require sweeping back and forth across the frequency space which becomes increasingly difficult for analysis of higher frequency spaces. The invention provides a continuous-time measure of the broader spectrum at all times resulting in a faster overall response.

Contrasted against the direct-digitization method, the invention does not rely on high-speed, high-resolution analog-to-digital converters which are power-intensive for higher frequencies. A secondary computer is also required, again greatly increasing the power requirement. The invention is scalable to higher frequencies without a dramatic increase in power consumption, and does not require high-performing analog-to-digital converters that are costly.

The invention could be designed in any feature-size, in any type of microelectronic fabrication technology or process, and with any power consumption requirement, and is not limited by the design described.

The choice of injection-locking oscillator is not limited to the design described. Any injection-locking oscillator that is a nonlinear oscillator can be used. Alternative oscillator designs include, but are not limited to single-ended ring oscillators, ring oscillators with a greater number of stages, ring oscillators that do not employ the cross-coupled pair shown in FIG. 11, LC oscillators that do employ the cross-coupled pair shown in FIG. 11, oscillators that accomplish the injection via one or more of the bias currents, and injection-locked frequency dividers.

The choice of phase detector is not limited to the design described. The phase detection can be altered in both the multiplying component, as well as the integration component as shown in FIG. 12. Alternative phase detection circuits include XOR-based, sample-and-hold based, charge-pump based and flip-flop based circuits.

The choice of amplitude-feedback method in the second configuration is not limited to the design described. Alternative feedback methods include various hardware solutions for sense/return, and different amplifiers.

The method of bias and the method of injection is not limited to the design described. Injection is also viable through bias current Ic (52-1 in FIG. 11). Ic and Is (52-2, 52-3 in FIG. 11) may be combined for compensated tuning of the center frequency and the locking region. Alternate types of mirroring circuits or reference circuits may also be used.

From the above description, it is apparent that various techniques may be used for implementing the concepts of the present invention without departing from its scope. The described embodiments are to be considered in all respects as illustrative and not restrictive. It should also be understood that system is not limited to the particular embodiments described herein, but is capable of many embodiments without departing from the scope of the claims.

What is claimed is:

1. An injection-locking oscillator (ILO) array comprising:
a parallel array of oscillator rings wherein each oscillator ring is coupled to simultaneously receive broadband RF signals having a power spectrum, each oscillator ring comprising:
a nonlinear injection-locking oscillator (ILO) for generating a first signal representative of a detected frequency from the received RF signals;
a phase detector for mixing the first signal and the RF signal to form a phase difference signal between the first signal and the RF signals;
a comparator for comparing the mixed signal with a predetermined threshold to form a readout signal representative of the detected RF signals;
wherein each ILO is tuned to oscillate with different natural frequencies where the phase response is a function of the input amplitude and frequency of the received RF signals to determine the presence of the RF signals;
means for correlating the response of at least two of the ILO that are locked to the same RF signal and yields a determined solution for both the amplitude and frequency,
and wherein each ILO includes single-ended ring oscillators.

2. The array of claim 1 wherein each ILO includes a two-stage, differential pair with a second cross-coupled pair to provide the requisite nonlinearity and a third input differential pair to provide the injection.

3. The array of claim 1 wherein each ILO includes ring oscillators with a greater number of stages.

4. The array of claim 1 wherein each ILO includes LC oscillators.

5. The array of claim 1 wherein the injection is accomplished via one or more of the bias currents.

6. The array of claim 1 wherein each ILO includes injection-locked frequency dividers.

7. The array of claim 1 wherein the phase detector includes a multiplying component and an integration component.

8. The array of claim 1 wherein the phase detector is XOR-based.

9. The array of claim 1 wherein the phase detector is sample-and-hold based.

10. The array of claim 1 wherein the phase detector is charge-pump based.

11. The array of claim 1 wherein the phase detector is flip-flop based.

12. An injection-locking oscillator (ILO) array comprising:
a parallel array of oscillator rings wherein each oscillator ring is coupled to simultaneously receive broadband RF signals having a power spectrum, each oscillator ring comprising:
a nonlinear injection-locking oscillator (ILO) for generating a first signal representative of a detected frequency from the received RF signals wherein each ILO includes single-ended oscillators;
a phase detector for mixing the first signals from neighboring pairs of the ILOs to form a phase difference signal between the first signals and the RF signals; and
a comparator for comparing the respective mixed signal with a predetermined threshold to form a readout signal representative of the detected RF signals.

13. The array of claim 12 including combinational logic for providing amplitude and frequency information about the detected RF signals.

14. An injection-locking oscillator (ILO) array comprising:
a parallel array of oscillator rings wherein each oscillator ring is coupled to simultaneously receive broadband RF signals having a power spectrum, each oscillator ring comprising:
an amplifier for generating amplified RF signals;
a nonlinear injection-locking oscillator (ILO) for generating an ILO signal representative of a detected frequency from the amplified RF signals;
a phase detector for mixing the ILO signal and the RF signal to form a phase difference signal between the first signal and the RF signals; and
a comparator for comparing the mixed signal with a predetermined threshold to form a readout signal representative of the detected RF signals and providing a closed-loop input to the respective amplifier for a higher precision readout output.

* * * * *